United States Patent [19]
Salimian et al.

[11] Patent Number: 5,656,123
[45] Date of Patent: Aug. 12, 1997

[54] DUAL-FREQUENCY CAPACITIVELY-COUPLED PLASMA REACTOR FOR MATERIALS PROCESSING

[75] Inventors: Siamak Salimian, Sunnyvale; Carol M. Heller, San Jose; Lumin Li, Santa Clara, all of Calif.

[73] Assignee: Varian Associates, Inc., Palo Alto, Calif.

[21] Appl. No.: 480,369

[22] Filed: Jun. 7, 1995

[51] Int. Cl.⁶ .................................................. C23F 1/02
[52] U.S. Cl. .................................. 156/345; 118/723 E
[58] Field of Search ................... 118/723 E, 723 ER, 118/723 MP; 156/643.1, 345; 216/71; 204/298.39

[56] References Cited

U.S. PATENT DOCUMENTS

| | | | |
|---|---|---|---|
| 4,262,631 | 4/1981 | Kubacki | 118/723 |
| 4,767,641 | 8/1988 | Kieser et al. | 427/38 |
| 4,913,929 | 4/1990 | Moslehi et al. | 427/39 |
| 5,041,201 | 8/1991 | Yamazaki et al. | 204/192.32 |
| 5,079,031 | 1/1992 | Yamazaki et al. | 427/38 |
| 5,272,417 | 12/1993 | Ohmi | 315/111.21 |
| 5,300,460 | 4/1994 | Collins et al. | 437/225 |
| 5,304,282 | 4/1994 | Flamm | 156/643 |
| 5,330,606 | 7/1994 | Kubota et al. | 156/345 |

FOREIGN PATENT DOCUMENTS

| | | | |
|---|---|---|---|
| 0042226 | 3/1983 | Japan | 118/723 E |
| 0091629 | 5/1985 | Japan | 118/723 E |
| 361202438 | 9/1986 | Japan | 118/723 E |
| 3170684 | 7/1991 | Japan | 118/723 E |
| 405078850 | 3/1993 | Japan | 118/723 E |
| 406033242 | 2/1994 | Japan | 118/723 E |

OTHER PUBLICATIONS

Haruhiro Goto et al., "Plasma Processing Equipment for Minimum Damage and chamber Contamination", *Solid State Technology*, Feb. 1991, pp. S13–S16.

Andrew A. Chambers, et al., "Etching of Phosphorous Doped Polysilicon Films", *Semiconductor International*, Jan. 1988, pp. 66–69.

*Primary Examiner*—John Niebling
*Assistant Examiner*—Joni Y. Chang
*Attorney, Agent, or Firm*—D'Alessandro & Ritchie

[57] ABSTRACT

The present invention is directed to a dual frequency capacitively-coupled plasma apparatus for materials processing. According to a first aspect of the present invention, a dual frequency triode reactor includes a VHF (30–300 MHz) RF power supply capacitively coupled to an upper reactor electrode and an HF (0.1–30 MHz) RF power supply capacitively coupled to a lower reactor electrode to which the wafer is attached. The VHF power supply is used to generate and control formation of a low sheath potential, high density plasma for minimum device damage and rapid etching/deposition while the HF power supply is used to provide a DC bias to the wafer substrate. According to a second aspect of the present invention, a tailored, powered upper electrode, at least a portion of which is generally conical in shape, is employed to provide a uniform etch across the diameter of the wafer.

8 Claims, 9 Drawing Sheets

DUAL-FREQUENCY CAPACITIVELY-COUPLED PLASMA REACTOR FOR MATERIALS PROCESSING

FIELD OF THE INVENTION

The present invention is directed to an apparatus for use in processing semiconductor devices, flat panel displays, and the like. More particularly, the present invention is directed to a novel HF/VHF dual frequency (triode) capacitively-coupled reactor design useable for sputter etching, reactive etching, plasma enhanced chemical vapor deposition, and similar plasma-assisted processes. Still more particularly, the present invention is directed to a dual frequency (triode) sputter clean reactor design which may be used, for example, as a pre-clean module of a physical vapor deposition (PVD) or chemical vapor deposition (CVD) metallization tool as might be found in an integrated cluster tool.

BACKGROUND OF THE INVENTION

Recently, demand for reduced feature size and increased device density on larger diameter silicon wafers has led to the emergence of the integrated cluster tool for semiconductor device fabrication. The integrated cluster tool is a multichamber vacuum system in which a number of working chambers are arranged around a central transfer chamber and in which each working chamber is isolated from the central transfer chamber by a pair of gate valves forming a vacuum lock. During operation, a semiconductor wafer can be processed in a working chamber, while the rest of the cluster apparatus is isolated from the environment of any of the other working chambers. After a wafer treatment is completed in a particular working chamber, the wafer is automatically passed back to the central transfer chamber through the vacuum lock and then passed automatically to a subsequent working chamber through another vacuum lock. The integrated cluster tool permits a plurality of various vacuum working chambers to be "clustered" around the central transfer chamber and permits the processing of a wafer through many of its most demanding processes without any requirement for the wafer to be passed back into ambient or clean room air. The integrated cluster tool is essentially a serial processing device. Typically, loads of 25 wafers are sequentially processed, one at a time, through the various processes of the cluster tool. Accordingly, high fabrication output rates depend upon utilizing a minimum of time in each processing step and maintaining the cluster tool operating a high percentage of the time.

Cluster tools for physical vapor deposition (PVD) of metallic films typically include a single pre-clean module (or reactor) utilizing a sputter etch process to remove oxide and other material from silicon wafers prior to deposition of metallic films. This is generally referred to as a pre-clean process or step. While the invention herein may be implemented as a stand alone processing module, it is preferably implemented as a module of an integrated cluster tool.

In processing semiconductor wafers to form integrated circuits thereon, plasma-assisted processes are frequently used both for deposition of materials onto the semiconductor wafer and for etching of materials from the semiconductor wafer. Such processes include plasma etching, reactive ion etching (RIE), plasma enhanced chemical vapor deposition (PECVD), as well as a number of other well known processes. In order to form and power a plasma, an RF (radio frequency) power source is generally used to provide power to one or more powered electrodes within a vacuum vessel containing a gas at a predetermined pressure in which the processing is to take place. A matching network is typically used to efficiently couple power from the RF power source to the powered electrode within vacuum chamber interior. The operation and construction of such matching networks is well known to those of ordinary skill in the art.

The creation of an electric field between electrodes within the vacuum chamber causes electrons present in the gas to initially collide elastically with gas molecules. As this process continues, the electrons gain more energy and eventually begin to collide inelastically with the gas molecules to form excited or ionized species. Eventually a steady state plasma is formed in which excitation and recombination of the atoms with electrons within the plasma are balanced. Highly reactive ions and radical species are produced in the plasma and may be used to etch or deposit materials on semiconductor wafers. Electric and magnetic fields formed within the vacuum chamber either by action of the plasma or by external application of magnetic fields and/or DC or RF self-induced biasing mechanisms are used to control the etching and deposition processes within the vacuum chamber.

Recent trends in the semiconductor industry include requirements for the production of finer and freer device features on larger and larger semiconductor and flat panel display substrates while achieving higher and higher throughput. The goal in the design of semiconductor fabrication equipment is thus to provide equipment capable of rapid processing, low downtime and low levels of contamination and device damage. It is also highly desirable to be able to achieve uniform etching across the relatively large surfaces presented by the 8" and 12" semiconductor substrates currently in production as well as even larger flat panel display substrates. Often these goals are in conflict with one another.

The simplest RF-powered reactor is the single frequency diode reactor. In a diode reactor RF energy is normally applied to the wafer table on which the wafer is disposed and an electrode above the semiconductor wafer serves as the ground. The plasma forms above the wafer, generally in a low pressure argon gas (generally at a pressure of about 5–10 millitort (mT)), and argon ions are accelerated down into the wafer to physically bombard and etch silicon or other materials from the wafer by an electric field formed between the plasma and the negatively charged wafer.

The RF excitation frequency used in the diode reactor has a significant effect on what goes on in the reactor. According to Collins et al. (U.S. Pat. No. 5,300,460) common prior art excitation frequencies used in these types of reactors include low frequencies (LF) (10–400 KHz), high frequencies (HF) (13–40 MHz (typically the ISM frequency at 13.56 MHz)), very high frequencies (VHF) (50–800 MHz), and microwave frequencies (typically the ISM frequency at 2.45 Ghz).

Each set of frequencies causes different physical phenomena in the plasma which may, or may not be desirable in a particular process. LF excitation is low enough in frequency that the electrons and ions can be directly accelerated by the oscillating electric field. This results in higher energy ions and a higher plasma potential. HF excitation leads to the formation of a plasma having a lower potential than when excited by an LF signal of similar power levels.

Sheath potentials are the potential difference between the plasma and the wafer, an electrode, a shield or wall of the reactor. Typical HF sheath potentials exceed 100 V and range to more than 1000 V. Sheath potentials are directly responsible for ion acceleration into the wafer. Microwave excitation in the range of 900 MHz–2.5 GHz results in plasma formation with relatively low sheath potentials, typically in the range of 10–30 V.

Dual frequency systems generally permit one RF frequency applied to a first powered electrode distant from the wafer to predominantly control and power the plasma while a second RF frequency provides wafer bias to control the sheath potential between a second powered electrode at the wafer and the plasma. In such systems, RF is normally coupled to the second powered electrode (wafer) with a capacitive coupling system. The capacitive coupling system achieves the formation of a self-induced DC bias to the wafer. This mechanism, well known to those of ordinary skill in the art, permits control of the sheath potential at the wafer independently of the sheath potential at the opposite powered electrode. This is important because while significant etching may be desired at the wafer, it is usually not desired at the opposite powered electrode which usually forms a permanent part of the equipment and such etching can damage the equipment and contaminate the chamber.

Dual frequency systems thus permit higher ion densities in the plasma which results in a higher ion flux into the wafer while permitting the sheath potential at the wafer to be independently controlled by the bias RF supply. This significantly effects etch rate—a higher density of ions usually results in a higher etch rate. The bias RF supply thus controls the energy of the ions bombarding the wafer independently of the plasma RF supply.

Triode reactors are also known which provide more flexibility than diode reactors. A typical arrangement is to provide a 13.56 MHz RF source to the upper electrode and a 100–450 KHz RF source to the lower electrode to which the wafer to be processed is attached. Such reactors provide a relatively low density plasma having a relatively high sheath voltage.

Split power triode reactors use a single RF source, typically 13.56 MHz, which is applied to a power divider. RF energy is applied to both the upper and lower electrodes. The relative phasing of the RF signal can be varied as can the relative power level. Etch selectivity and substrate temperature can be adjusted effectively by varying the relative phase of the two RF signals.

Electron cyclotron resonance (ECR) reactors are known which provide a relative high ion density. They typically utilize a microwave power source and a solenoid to form a plasma along an axis of the solenoid. A magnetic field along the axis of the solenoid constrains electrons to orbit the axis at the resonance frequency (which depends upon the magnetic field intensity caused by the solenoid). A conventional RF source is generally capacitively coupled to the wafer electrode to control ion energy at the wafer. These systems provide a generally low sheath potential due to the microwave excitation, but tailored to increase the sheath potential for improved anisotropy with application of increased 13.56 MHz excitation. These systems can achieve high plasma densities and high etch rates.

Inductively coupled plasma (ICP) reactors operate by coupling RF from an RF power supply into the plasma, generally by means of a coil, solenoid or similar inductive mechanism. A prior art ICP reactor 100 is shown schematically in FIG. 4. Vacuum chamber 102 communicates with a vacuum pump 104 and argon gas supply 106 for controlling the gas environment within chamber 102. An inductive coupling coil 108 is disposed about chamber 102 and is powered by plasma RF power source 110 via RF matching network 112. A bias RF power source 114 is capacitively coupled to wafer table (powered electrode) 116 via RF matching network 118. A wafer 120 to be etched is disposed on wafer table 116.

Despite the variety of arrangements for providing power to the plasma of a reactor, there is room for improvement in such reactors, particularly in terms of being able to control the sheath potential and the plasma density independently so as to be able to achieve high plasma densities with low sheath potentials between the plasma RF power electrode and the plasma.

SUMMARY OF THE INVENTION

The present invention is directed to a dual frequency capacitively-coupled plasma apparatus for materials processing. According to a first aspect of the present invention, a dual frequency triode reactor includes a VHF (30–300 MHz) plasma RF power supply capacitively coupled to an a first powered reactor electrode and an HF (0.1–30 MHz) bias RF power supply capacitively coupled to a second powered reactor electrode to which the wafer is attached for independent formation of a self-induced DC bias voltage at the wafer. The VHF power supply is used to generate and control formation of a low sheath potential, high density plasma for rapid etching/deposition with a small sheath voltage between the first powered electrode and the plasma while the HF power supply is used to provide a DC bias to the second powered electrode (wafer substrate) for independently controlling ion energies.

According to a second aspect of the present invention, a tailored, powered upper electrode, generally conical in shape at its outer periphery, is employed to provide a more uniform etch across the diameter of the wafer.

OBJECTS OF THE INVENTION

Accordingly, it is an object of the present invention to provide a novel dual frequency capacitively coupled triode plasma reactor.

It is a further object of the present invention to provide a dual frequency capacitively coupled triode plasma reactor capable of providing a high power to the plasma with a relatively low positive potential so that a relatively ion dense (on the order of $10^{11}$ ions/cc) plasma is formed while little or no etching of the top electrode or other surfaces of the interior of the reactor in contact with or in close proximity to the plasma occurs.

It is a further object of the present invention to provide a dual frequency capacitively coupled triode plasma reactor which employs an HF RF signal to bias the wafer substrate and a VHF RF signal to excite the plasma.

It is a further object of the present invention to provide a dual frequency capacitively coupled triode plasma reactor with a tailored powered electrode coupled to a plasma driving RF source for making the etch rate across the wafer diameter more uniform.

Still another object of the present invention to provide a dual frequency capacitively coupled triode plasma reactor which employs an HF RF signal at approximately 13.56 MHz to bias the wafer substrate and a VHF RF signal at approximately 60 MHz to excite the plasma.

These and many other objects and advantages of the present invention will become apparent to those of ordinary skill in the art from a consideration of the drawings and ensuing description of the invention.

DETAILED DESCRIPTION OF THE INVENTION

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
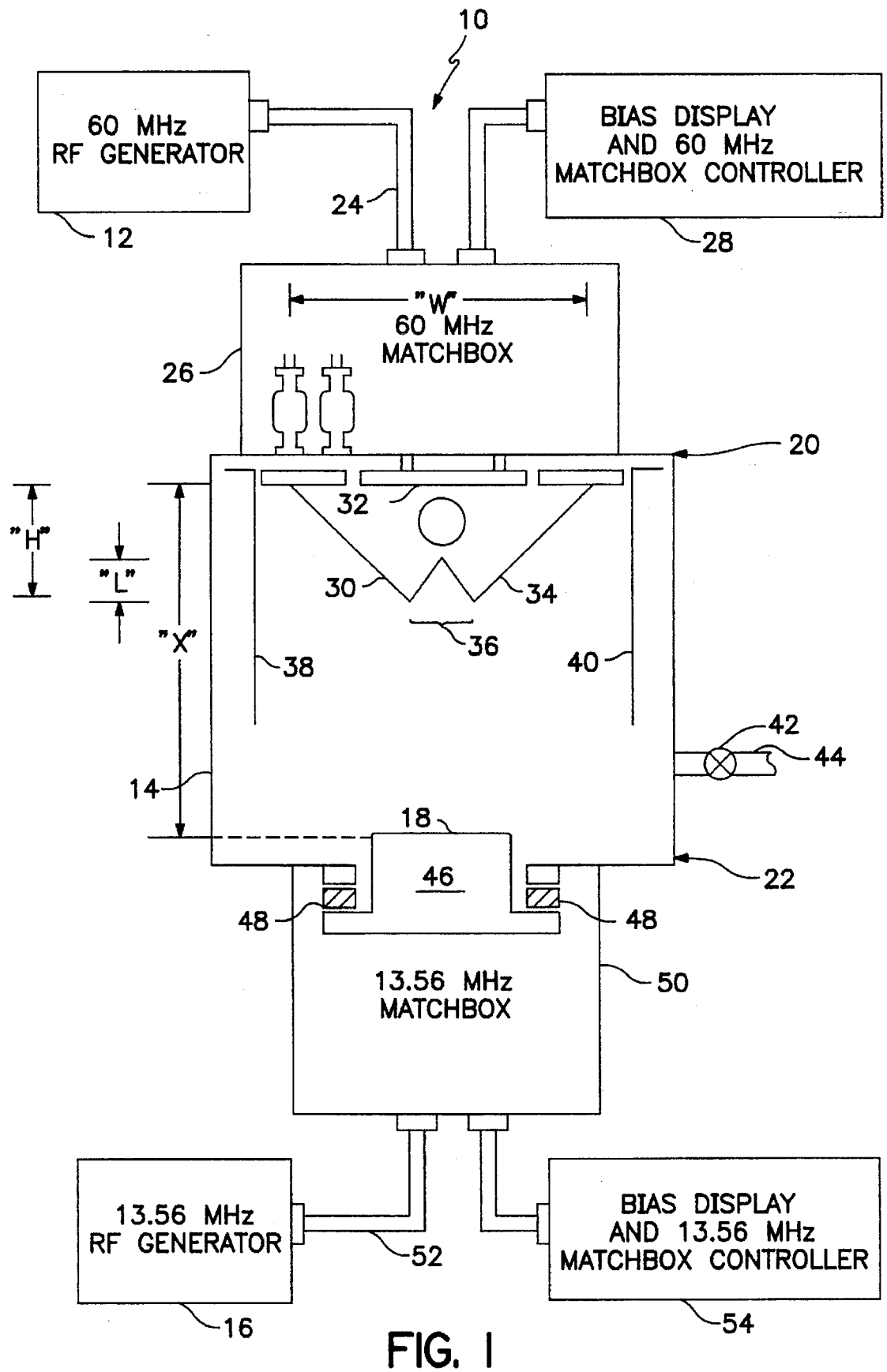
FIG. 1 is a schematic diagram of the dual frequency capacitively coupled triode plasma reactor of the present invention.
Figure 2:
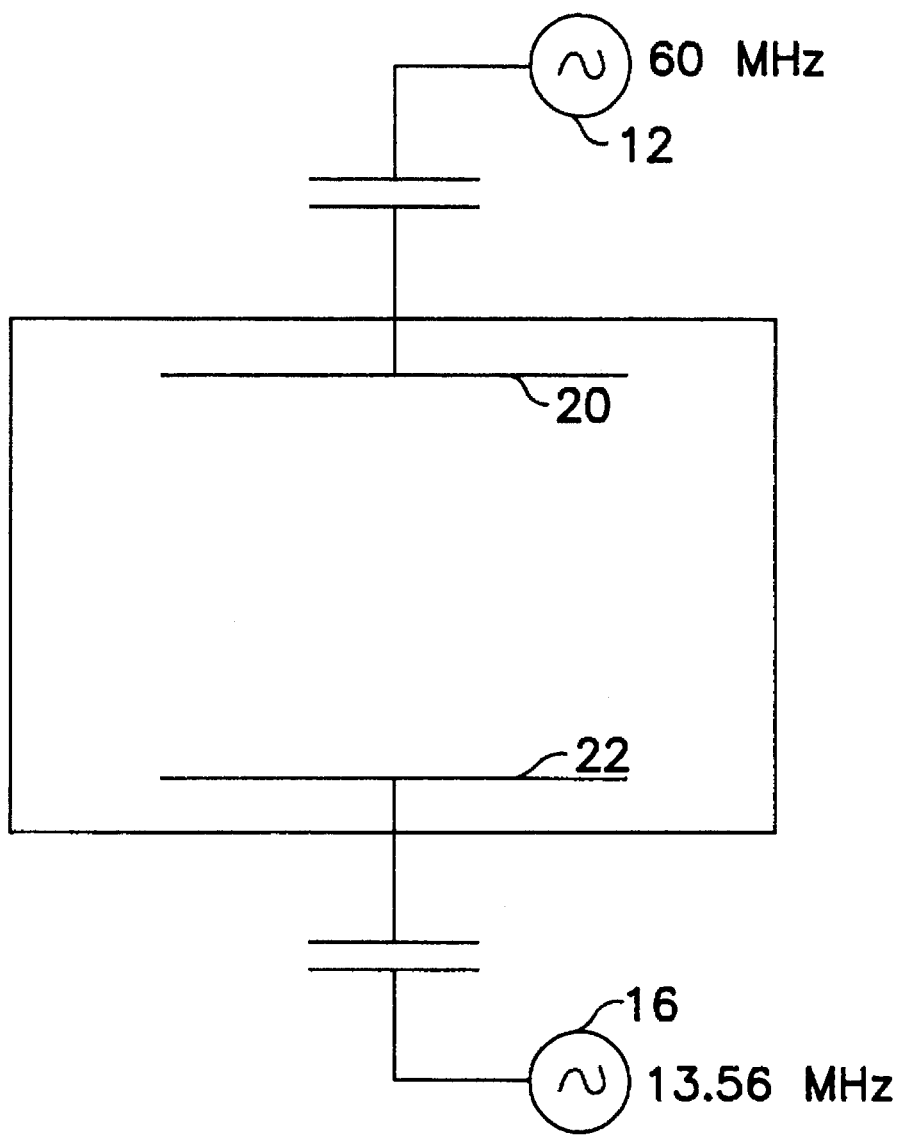
FIG. 2 is an electrical schematic diagram of the dual frequency capacitively coupled triode plasma reactor of the present invention.
Figure 3:
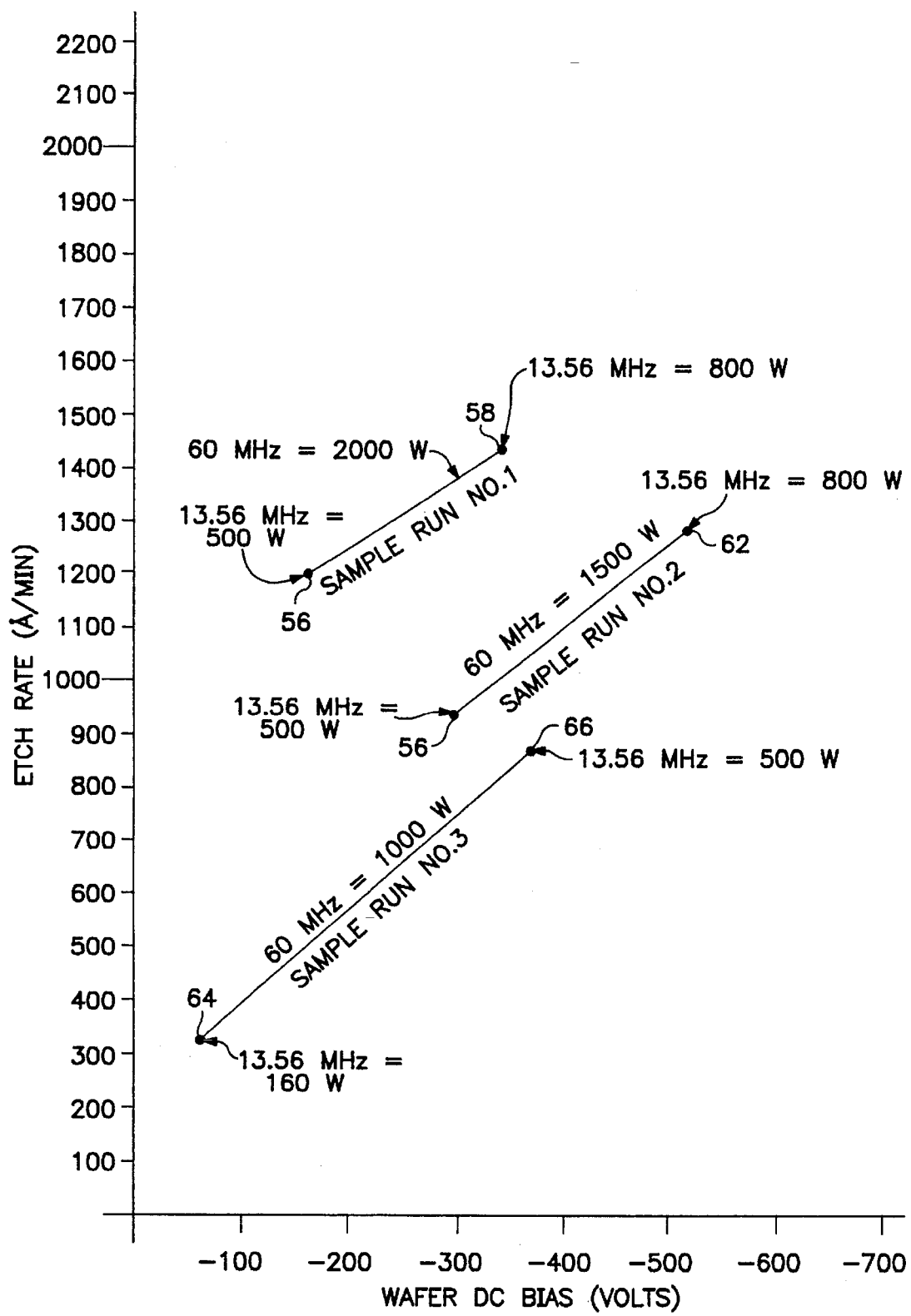
FIG. 3 is a graph of the $SiO_2$ etch rate vs. DC bias for different 60 MHz applied power values at 1.2 mT argon of the dual frequency capacitively coupled triode plasma reactor of the present invention.
Figure 4:
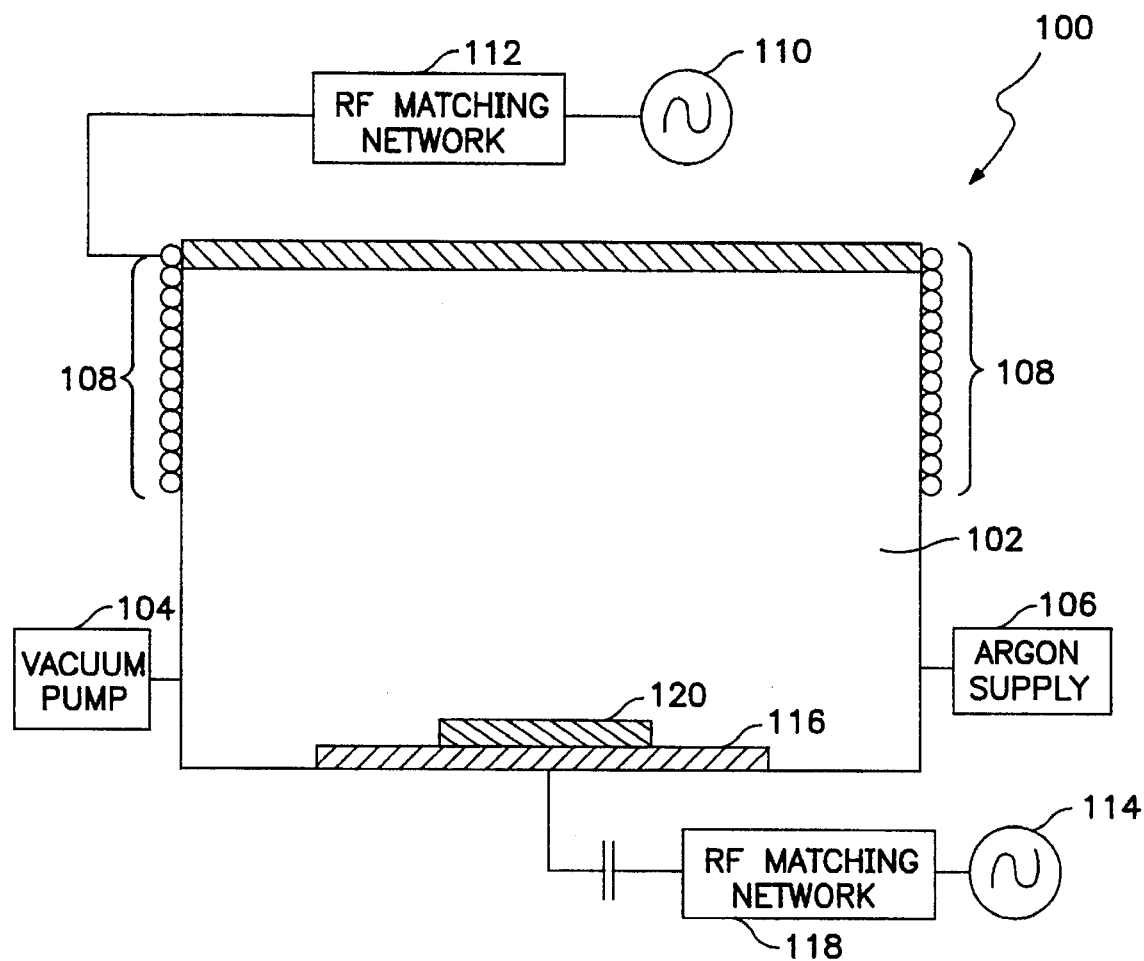
FIG. 4 is a schematic drawing of an inductively coupled plasma (ICP) reactor according to the prior art.

A dual frequency triode plasma reactor 10 for processing semiconductor devices and flat panel displays is shown at FIG. 1. A 60 MHz RF power generator 12 is utilized to generate a low potential/high density ($10^{11}$ ions/cc) plasma within vacuum chamber 14. A lower frequency 13.56 MHz RF generator 16 is used to bias the substrate of wafer 18 being processed. The system has been used to sputter etch 200 mm $SiO_2$-coated wafers. The reactor is a parallel plate reactor having an upper electrode 20 ("first powered electrode") and a lower electrode 22 ("second powered electrode"). The 60 MHz RF is applied to the upper electrode 20 and the 13.56 MHz RF is applied to the lower electrode 22. The shape of upper electrode 20 is preferably, though not necessarily, tailored in accordance with co-pending U.S. patent application Ser. No. 08/476,966 filed on even date herewith, and which is hereby incorporated by reference as if set forth fully herein. Such tailoring permits a more uniform etching across the surface of the wafer. FIG. 3 shows $SiO_2$ etch rate vs. 13.56 MHz self-induced DC bias for different 60 MHz power levels. Sputter etch rates of more than 500 Å per minute at a low pressure of about 1.2 mT and low bias conditions of less than about 200 VDC have been achieved with this device and indicate the presence of the high density of ions required for most efficient semiconductor processing applications. Visual inspection of the reactor indicates that no etching of the top electrode 20 occurred. This is the result of the low-potential plasma generated at 60 Mhz.

Instead of a VHF RF signal of precisely 60 MHz, a VHF signal in the range of about 30 MHz to about 300 MHz would also work to achieve similar results. Similarly, the HF RF signal need not be precisely 13.56 MHz but could be supplied in the range of about 0.1 MHz (100 KHz) to about 30 MHz in order to achieve similar results. The exact frequencies chosen may be chosen to correspond to internationally recognized industrial/scientific/medical (ISM) apparatus frequencies and/or the output frequencies of commercially available RF power supplies. A VHF signal is desirable in this application because frequencies in this range are more effective than lower frequencies (1) at breaking down etch gasses into reactive radicals and (2) initiating a plasma. The pressure required to achieve the same result is lower, resulting in longer mean free paths for the ions in the plasma which, in turn, enables better anisotropic etching. A VHF signal is preferred to a higher frequency signal because it is more difficult and expensive to generate significant power levels and couple them into the plasma at frequencies above VHF.

Turning again to FIG. 1, a 60 MHz RF signal from 60 MHz RF generator 12 travels on coaxial cable 24 to 60 MHz Matchbox 26. 60 MHz Matchbox 26 is controlled and monitored in a conventional manner (fixed power output, allowing the bias voltage to float) by Bias Display and 60 MHz Matchbox Controller 28. 60 MHz Matchbox 26 is preferably an automatic matching network under feedback control which matches the impedance of coaxial cable 24 to the impedance presented by upper electrode 20 on a continuous basis. It includes blocking capacitors which achieve capacitive coupling between coaxial cable 24 and upper electrode 20. Matching networks of this type are well known in the art and will not be discussed further herein to avoid over-complicating the disclosure.

Figure 6:
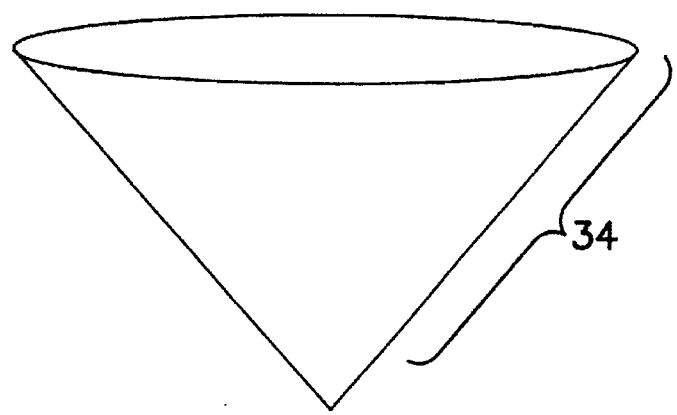
FIG. 6 is a perspective drawing of a first powered electrode according to a first presently preferred embodiment of the present invention.
Figure 7:
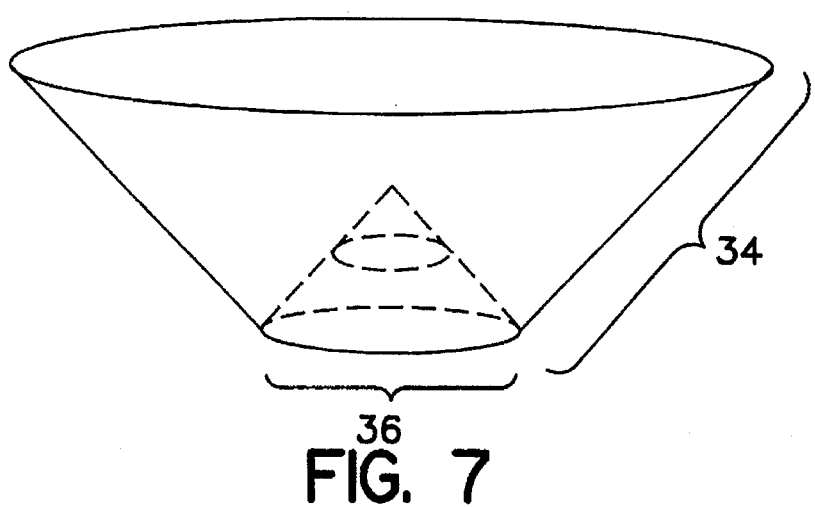
FIG. 7 is a perspective drawing of a first powered electrode according to a second presently preferred embodiment of the present invention.
Figure 8:
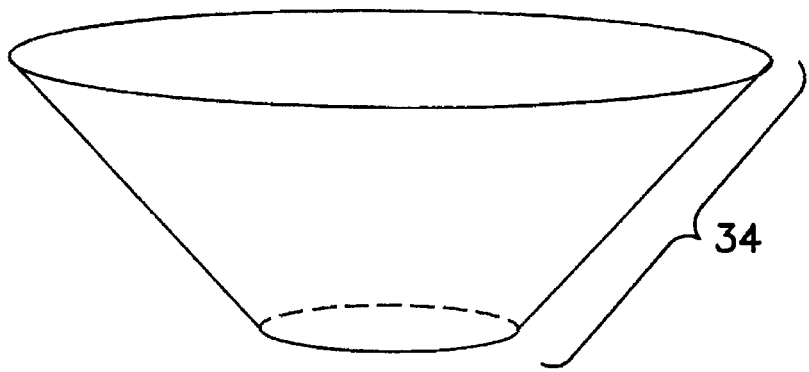
FIG. 8 is a perspective drawing of a first powered electrode according to a third presently preferred embodiment of the present invention.

Upper electrode 20 may comprise a single flat conductive plate as used in the prior art (not shown), or, more preferably, comprises a tailored electrode designed for uniform etch across the diameter of the wafer. Upper electrode 20 thus comprises an active powered electrode portion 30 and an optional floating electrode portion 32 which is not directly connected to portion 30. Portion 30 is preferably a conical conductor over portion 34 and, more preferably, includes a reverse conical conducting portion 36 at its center as shown. It has been found that these arrangements (pure conical (FIG. 6), conical with reverse conical at center (FIG. 7), and conical with flat portion at center (FIG. 8)) yield much more uniform etch rates across the wafer diameter than do flat plate electrodes under similar conditions.

Figure 9:
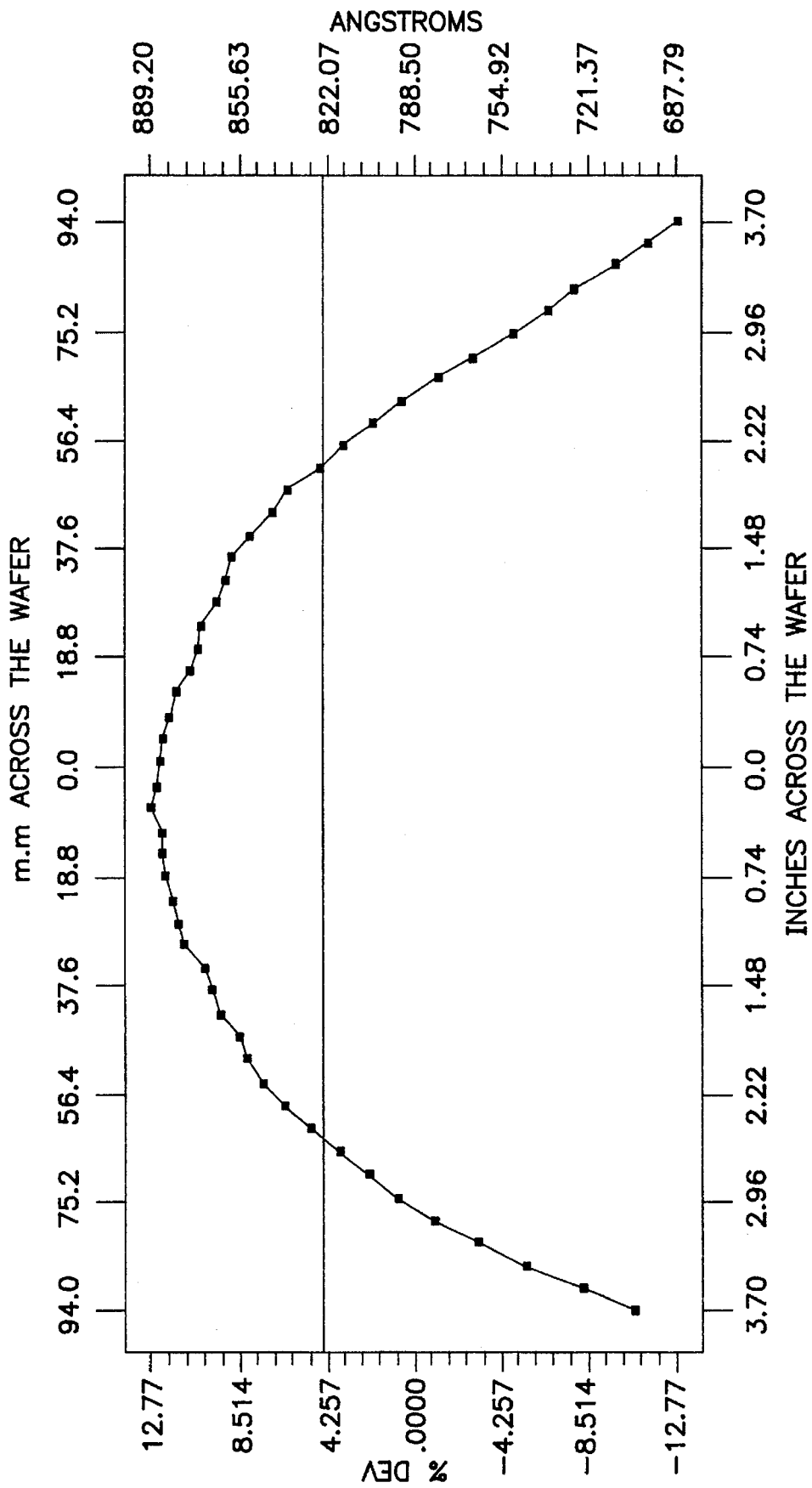
FIGS. 9–11 are differential etch profiles of different configurations of first powered electrodes as used according to presently preferred embodiments of the present invention.
Figure 10:
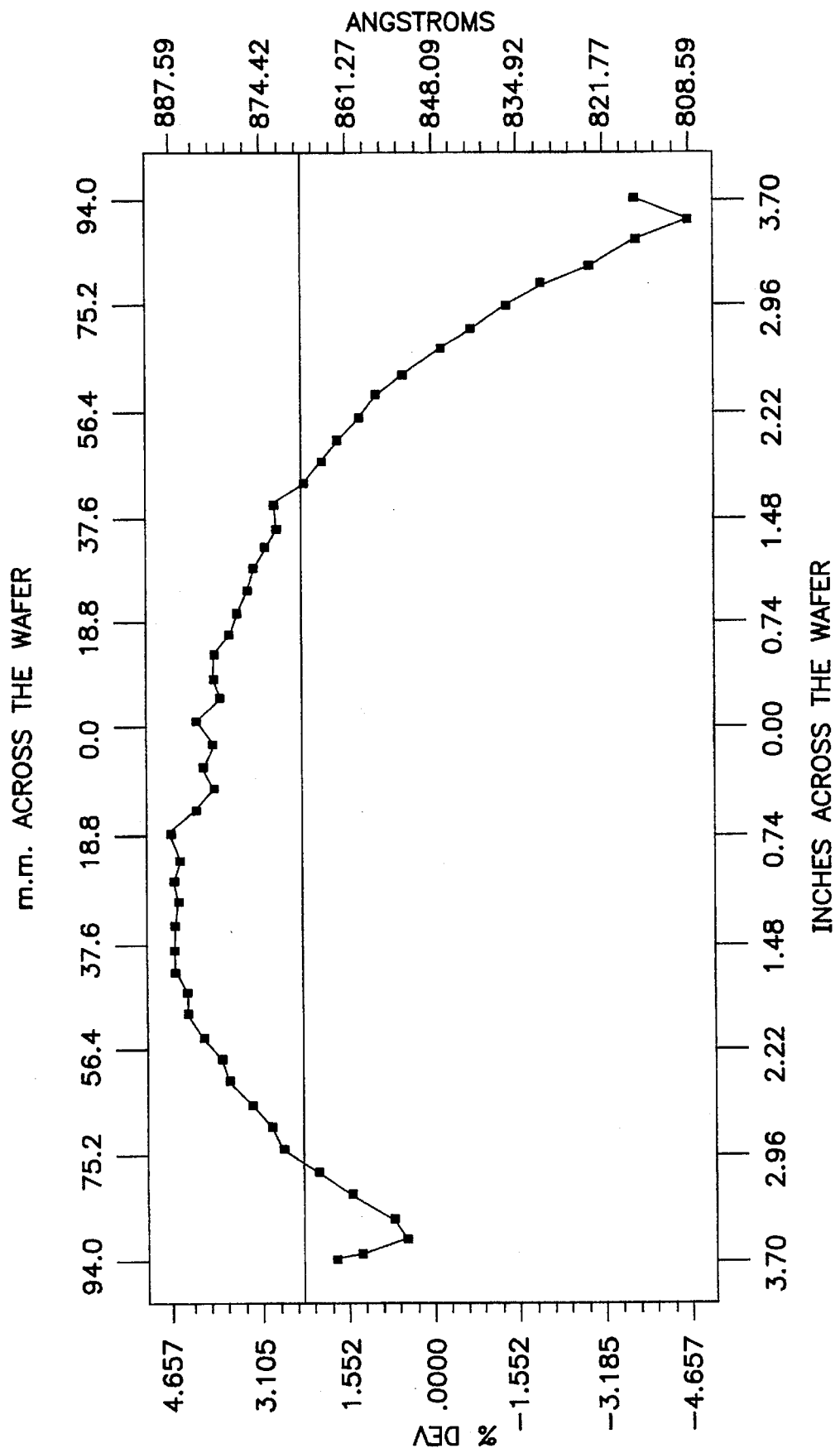
Figure 11:
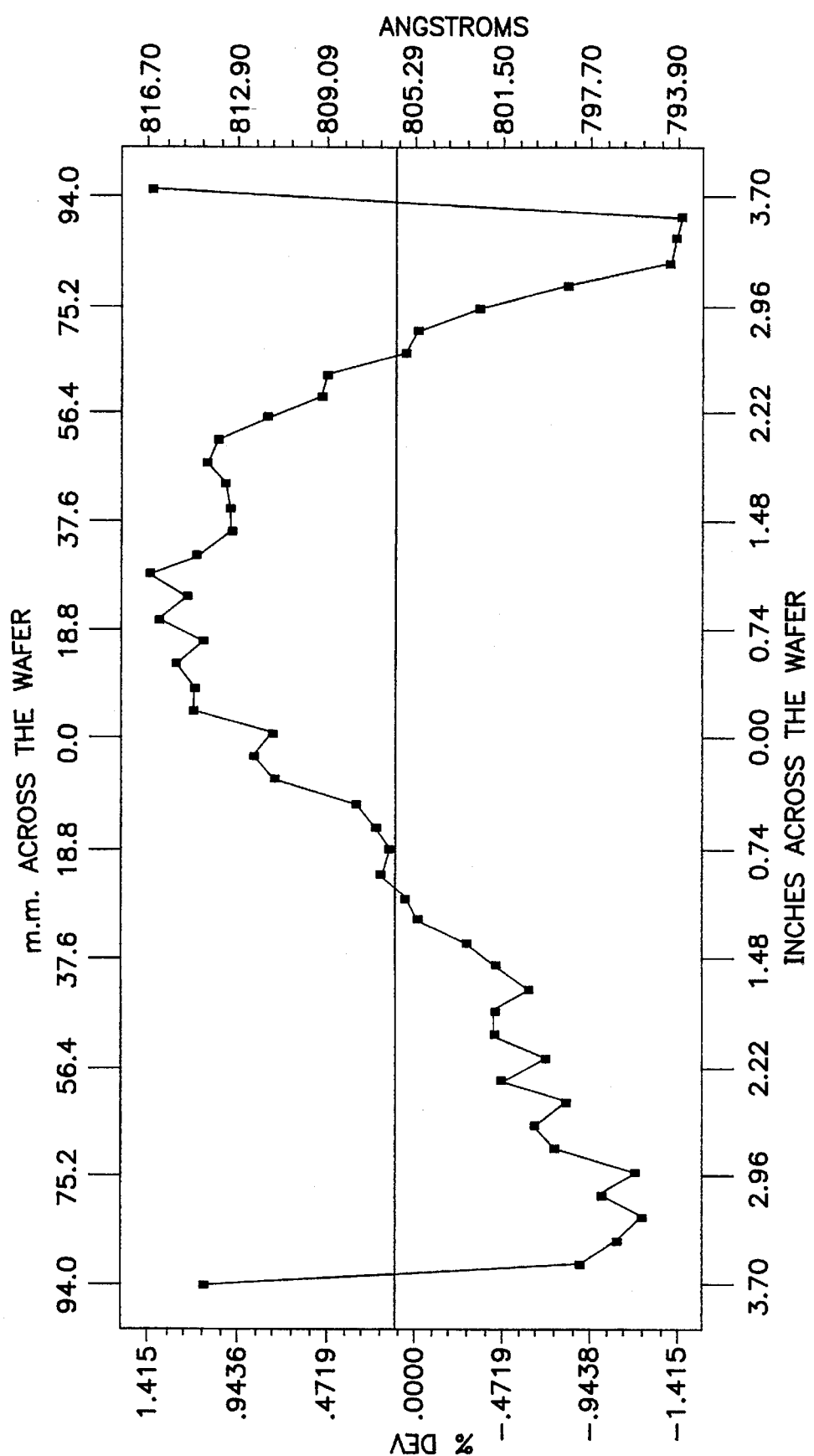

Perfectly uniform etching is an ideal which is difficult to realize in practice, however, a perfectly uniform etch of depth "Z" would leave the etched wafer exactly a distance "Z" thinner at each point. A differential etch profile as used herein refers to a profile produced by the PROMETRIX (tm) SpectraMap (tm) SM200 (tm) as shown in FIGS. 9–11. The differential etch profile looks at the wafer before the etch and after the etch and shows any non-uniformities that occurred. A perfect etch would show a flat line at 0 on the differential etch profile. Some experimental results on the uniform etching feature of the present invention are shown at FIGS. 9, 10 and 11. In each of FIGS. 9–11, the reactor used was substantially as shown in FIG. 1. The differences from FIG. 1 are not considered significant. FIG. 9 shows the differential etch profile of essentially a parallel plate reactor. In this particular case the dimensions for "W" and "X" (marked on FIG. 1) were 10.5" and 5.9", respectively. An etch result like this would generally be considered poor. FIG. 10 shows the differential etch profile of a reactor using the tailored top powered electrode configuration of FIG. 6 (conical). In this particular case, "W" was 10.5", "X" was 4.4", and the height "H" of the cone was 1.7". The etch result is good. FIG. 11 shows the differential etch profile of a reactor using the tailored top powered electrode configuration of FIG. 7 (conical with reversed conical portion). In this particular case, "W" was 10.5", "X" was 4.4", "H" was 1.7" and "L" was 0.9". The etch result is very good. It is believed that the powered electrode designs of FIGS. 6, 7 and 8 serve to reduce the plasma density in the regions where they are closer to the second powered electrode in a manner that is related to the geometric distance between the two powered electrode surfaces, thus the result is that an electrode shape in roughly the opposite shape of the differential etch profile for a parallel plate reactor configuration serves to make much more uniform the etch profile. The conical shapes may thus also be modified slightly, as in rounding them, or the like, without departing from the scope of the present invention.

In all cases the upper electrode may be either unperforated, or, more preferably, perforated to permit more etched material to be deposited on the electrode before cleaning is necessary. (See, e.g., co-pending U.S. patent application Ser. No. 08/474,591, filed on even date herewith, and which is hereby incorporated by reference as if set forth fully herein.) Reactor chamber 14 also includes reactor plasma confinement shields 38, 40 as well known in the art. A valve 42 controls the supply of argon gas (for forming the plasma) from line 44.

Wafer table 46 supports wafer 18 in a conventional manner and is separated from the metallic (and electrically conductive) vacuum chamber 14 by ceramic insulators 48. Below wafer table 46 is the 13.56 MHz Matchbox 50 which operates much the same as 60 MHz Matchbox 26. Again, blocking capacitors are included to aid in achieving a DC bias on the substrate with an applied RF signal.

A 13.56 MHz RF Generator 16 provides an RF signal on transmission line 52 to the 13.56 MHz Matchbox which automatically tunes out any difference in impedance between transmission line 52 and lower electrode 22. A Bias Display and 13.56 MHz Matchbox Controller 54 handles control of the 13.56 MHz Matchbox in a conventional manner.

Turning now to FIG. 3, a graph of the $SiO_2$ etch rate vs. DC bias for different 60 MHz applied power values at 1.2 millitorr (mT) argon of the dual frequency capacitively coupled triode plasma reactor of the present invention is presented. Six actual data points are shown. "Sample Run No. 1" comprises points 56 and 58. This run was done with a 60 MHz applied power level of 2000 W. At point 56, the applied 13.56 MHz power level is 500 W, at point 58 it is 800 W. Etch rates are relatively high ranging from a low of about 1200 Å/min to a high of about 1400 Å/min.

"Sample Run No. 2" comprises points 60 and 62. The run was done with a 60 MHz applied power level of 1500 W. 13.56 MHz power levels ranged from 500 W to 800 W. Etch rates ranged from about 950 Å/min to about 1300 Å/min.

"Sample Run No. 3" comprises points 64 and 66. The run was done with a 60 MHz applied power level of 1000 W. 13.56 MHz power levels ranged from 160 W to 500 W. Etch rates ranged from about 325 Å/min to about 850 Å/min.

Thus, for example, as can be seen from FIG. 3, for a given Wafer DC bias of 200 VDC, at 1000 W of 60 MHz power, the etch rate is about 550 Å/min; at 1500 W it is expected to be about 750 Å/min, and at 2000 W it is about 1250 Å/min. Accordingly, in the triode reactor of the present invention, controlling the VHF power to the top electrode directly controls the plasma density and etch rate for a given wafer DC bias.

Figure 5:
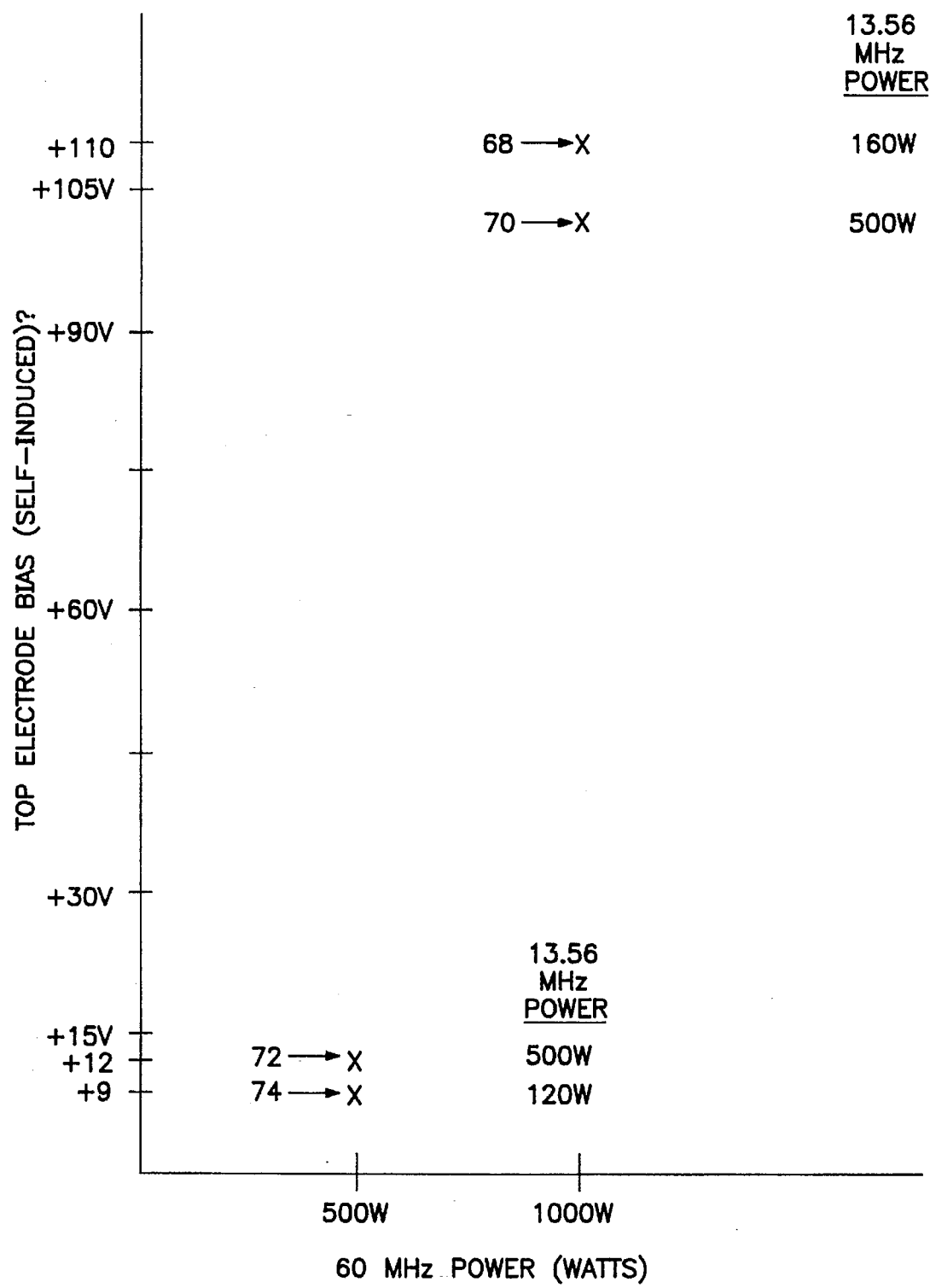
FIG. 5 is a plot showing the self-induced bias (in DC volts) of the top electrode in a dual frequency capacitively coupled triode reactor according to the present invention plotted against applied 60 MHz plasma drive power (in watts).

Turning now to FIG. 5, a plot showing the self-induced bias (in DC volts) plotted against the applied 60 MHz plasma drive power (in watts) is shown. Point 68 was taken at a 13.56 MHz applied power level of 160 W and 60 MHz applied power level of 1000 W for a top electrode bias of +110 VDC. Point 70 was taken at a 13.56 MHz applied power level of 500 W and 60 MHz applied power level of 1000 W for a top electrode bias of +102 VDC. Point 72 was taken at a 13.56 MHz applied power level of 500 W and 60 MHz applied power level of 500 W for a top electrode bias of +12 VDC. Point 74 was taken at a 13.56 MHz applied power level of 120 W and 60 MHz applied power level of 500 W for a top electrode bias of +9 VDC. Thus in each case the top electrode bias is slightly low relative to the plasma potential with this configuration. Thus there will not be significant etching of the top electrode by the plasma and this has been confirmed by inspection.

While illustrative embodiments and applications of this invention have been shown and described, it would be apparent to those skilled in the art that many more modifications than have been mentioned above are possible without departing from the inventive concepts set forth herein. Specifically, while the first powered electrode is often referred to as the "top" or "upper" electrode herein, there is nothing to prevent the apparatus from being constructed so that the wafer is held with its processed side facing down rather than up as shown. Clamping devices are known in the art which can achieve this orientation. The invention, therefore, is not to be limited except in the spirit of the appended claims.

What is claimed is:

1. A dual frequency, capacitively coupled, plasma reactor for materials processing, said reactor comprising:

a vacuum chamber;

a first and a second powered electrode disposed within said vacuum chamber; and means for coupling a semiconductor wafer within said vacuum chamber to said second powered electrode, said first powered electrode coupled to a source of VHF RF energy having a frequency in the range of about 30 MHz to about 300 MHz and having a shape including a first generally conically-shaped portion lacking an apex disposed at an outer periphery of said first powered electrode, said first generally conically-shaped portion directed toward said second powered electrode, and a second generally conically-shaped portion having an apex directed away from said second powered electrode, said second generally conically-shaped portion disposed substantially at a center of said second powered electrode and connected to said first generally conically-shaped portion, and said second powered electrode coupled to a source of HF RF energy having a frequency in the range of about 0.1 MHz to about 30 MHz.

2. A dual frequency, capacitively coupled, plasma reactor for materials processing, said reactor comprising:

a vacuum chamber;

a first powered electrode disposed within said vacuum chamber;

a second powered electrode disposed within said vacuum chamber; and means for coupling a semiconductor wafer within said vacuum chamber to said second powered electrode, said first powered electrode having a shape including a first generally conically-shaped portion lacking an apex disposed at an outer periphery of said first powered electrode, said first generally conically-shaped portion directed toward said second powered electrode, and a second generally conically-shaped portion having an apex directed away from said second powered electrode, said second generally conically-shaped portion disposed substantially at a center of said second powered electrode and connected to said first generally conically-shaped portion and being coupled to a source of VHF RF energy having a frequency of approximately 60 MHz, and said second powered electrode coupled to a source of HF RF energy having a frequency of approximately 13.56 MHz.

3. A dual frequency, capacitively coupled, plasma reactor for materials processing, said reactor comprising:

a vacuum chamber;

a first and a second powered electrode disposed within said vacuum chamber, said first powered electrode coupled to a source of VHF RF energy having a frequency in the range of about 30 MHz to about 300 MHz and having a shape including a first generally conically-shaped portion lacking an apex disposed at an outer periphery of said first powered electrode, said first generally conically-shaped portion directed toward said second powered electrode, and a second generally conically-shaped portion having an apex directed away from said second powered electrode, said second generally conically-shaped portion disposed substantially at a center of said second powered electrode and connected to said first generally conically-shaped portion; and said second powered electrode disposed within said vacuum chamber, said second powered electrode coupled to a source of HF RF energy having a frequency in the range of about 0.1 MHz to about 30 MHz and having a generally flat shape for supporting and contacting material to be processed within the reactor.

4. A dual-frequency, capacitively coupled, plasma reactor for materials processing, said reactor comprising:

a vacuum chamber;

a first and a second powered electrode disposed within said vacuum chamber;

said first powered electrode coupled to a source of VHF RF energy having a frequency in the range of about 30 MHz to about 300 MHz and having a shape including a first generally conically-shaped portion lacking an apex disposed at an outer periphery of said first powered electrode, said first generally conically-shaped portion directed toward said second powered electrode, and a second generally conically-shaped portion having an apex directed away from said second powered electrode, said second generally conically-shaped portion disposed substantially at a center of said second powered electrode and connected to said first generally conically-shaped portion;

said second powered electrode disposed within said vacuum chamber, said second powered electrode coupled to a source of HF RF energy having a frequency in the range of about 0.1 MHz to about 30 MHz and having a generally flat shape for supporting and contacting material to be processed within the reactor.

5. A method of etching a silicon wafer, said method comprising the steps of:

placing the silicon wafer into a vacuum chamber having a first powered electrode and a second powered electrode, said first powered electrode having a shape including a first generally conically-shaped portion lacking an apex disposed at an outer periphery of said first powered electrode, said first generally conically-shaped portion directed toward said second powered electrode, and a second generally conically-shaped portion having an apex directed away from said second powered electrode, said second generally conically-shaped portion disposed substantially at a center of said second powered electrode and connected to said first generally conically-shaped portion;

placing the wafer into electrical contact with said second powered electrode;

applying a source of VHF RF energy in the range of about 30 MHz to about 300 MHz to said first powered electrode in order to form a plasma within said vacuum chamber; and applying a source of HF RF energy in the range of about 0.1 MHz to about 30 MHz to said second powered electrode in order to provide a self-induced DC bias to said wafer in order to control the energy of ions from said plasma striking the wafer.

6. A method of etching a silicon wafer, said method comprising the steps of:

placing the silicon wafer into a vacuum chamber having a first powered electrode and a second powered electrode, the first powered electrode having a shape including a first generally conically-shaped portion lacking an apex disposed at an outer periphery of said first powered electrode, said first generally conically-shaped portion directed toward said second powered electrode, and a second generally conically-shaped portion having an apex directed away from said second powered electrode, said second generally conically-shaped portion disposed substantially at a center of said second powered electrode and connected to said first generally conically-shaped portion;

placing the wafer into electrical contact with said second powered electrode;

applying a source of VHF RF energy in the range of about 30 MHz to about 300 MHz to said first powered electrode in order to form a plasma within said vacuum chamber;

applying a source of HF RF energy in the range of about 0.1 MHz to about 30 MHz to said second powered electrode in order to provide a self-induced DC bias to said wafer in order to control the energy of ions from said plasma striking the wafer.

7. A method of etching a silicon wafer, said method comprising the steps of:

placing the silicon wafer into a vacuum chamber having a first powered electrode and a second powered electrode, the first powered electrode having a shape including a first generally conically-shaped portion lacking an apex disposed at an outer periphery of said first powered electrode, said first generally conically-shaped portion directed toward the second powered electrode, and a second generally conically-shaped portion having an apex directed away from said second powered electrode, said second generally conically-shaped portion disposed substantially at a center of said second powered electrode and connected to said first generally conically-shaped portion;

placing the wafer into electrical contact with said second powered electrode;

applying a source of VHF RF energy in the range of about 30 MHz to about 300 MHz to said first powered electrode in order to form a plasma within said vacuum chamber;

applying a source of HF RF energy in the range of about 0.1 MHz to about 30 MHz to said second powered electrode in order to provide a self-induced DC bias to said wafer in order to control the energy of ions from said plasma striking the wafer.

8. A method according to claim 7 wherein said second powered electrode is a flat electrode.

* * * * *